US00RE38072E

(19) United States
(12) Reissued Patent
Kondo et al.

(10) Patent Number: US RE38,072 E
(45) Date of Reissued Patent: Apr. 8, 2003

(54) FABRICATION METHOD FOR ALGAINNPASSB BASED DEVICES

(75) Inventors: Masahiko Kondo, Kodaira (JP); Kazuhisa Uomi, Hachioji (JP); Hitoshi Nakamura, Kanagawa-ken (JP)

(73) Assignee: Hitachi, Ltd., Tokyo (JP)

(21) Appl. No.: 09/924,504

(22) Filed: Aug. 9, 2001

Related U.S. Patent Documents

Reissue of:
(64) Patent No.: 5,937,274
Issued: Aug. 10, 1999
Appl. No.: 08/993,035
Filed: Dec. 18, 1997

U.S. Applications:
(62) Division of application No. 08/381,418, filed on Jan. 31, 1995, now abandoned.

(51) Int. Cl.[7] ..... H01L 21/20
(52) U.S. Cl. ..... 438/47; 438/45; 438/91; 372/45; 257/186
(58) Field of Search ..... 438/45, 46, 47, 438/91; 372/45, 96; 257/186

(56) References Cited

U.S. PATENT DOCUMENTS

| | | | | |
|---|---|---|---|---|
| 4,750,183 A | * | 6/1988 | Yakahashi et al. | 372/45 |
| 4,905,246 A | * | 2/1990 | Hayakawa et al. | 372/45 |
| 4,999,844 A | * | 3/1991 | Imamoto | 372/45 |
| 5,173,751 A | * | 12/1992 | Ota et al. | |
| 5,244,749 A | * | 9/1993 | Bean et al. | 372/45 |
| 5,309,467 A | * | 5/1994 | Terakado | 372/45 |
| 5,383,211 A | * | 1/1995 | Van de Walle et al. | 372/43 |
| 5,491,710 A | * | 2/1996 | Lo | 372/45 |
| 5,633,192 A | * | 5/1997 | Moustakas et al. | |

FOREIGN PATENT DOCUMENTS

| | | | |
|---|---|---|---|
| JP | 1211912 | * | 8/1989 |
| JP | 7154023 | * | 6/1995 |

OTHER PUBLICATIONS

"Gallium arsenide and other compound semiconductors on silicon" by S. F. Fang, et al., J. Appl. Phys. 68(7), Oct. 1, 1990.*

"Semiconductor lasers on Si substrates using the technology of bonding by atomic rearrangement", by Y. H. Lo, et al., Appl. Phys. Lett., vol. 62, pp. 1038–1040, 1993.*

"Heterostructure Lasers" by H. C. Casey, Jr. et al., Academic Press, New York, 1978, pp. 8–9.*

"Luminescence quenching and the formation of the $Gap_{1-x}N_x$ alloy in Gap with increasing nitrogen content" by J. N. Baillargeon, et al., Appl. Phys. Lett. vol. 60, pp. 2540–2442, 1992.*

(List continued on next page.)

*Primary Examiner*—Keith Christianson
(74) *Attorney, Agent, or Firm*—Antonelli, Terry, Stout & Kraus, LLP

(57) ABSTRACT

A fabrication process for a semiconductor device including a plurality of semiconductor layers, the plurality of semiconductor layers including at least a nitrogen-containing alloy semiconductor $Al_aGa_bIn_{1-a-b}N_xP_yAs_zSb_{1-x-y-z}$ ($0 \leqq a \leqq 1, 0 \leqq b \leqq 1, 0<x<1, 0 \leqq y<1, 0 \leqq z<1$), and a method of making the semiconductor device and apparatus. For at least two semiconductor layers out of the plurality of semiconductor layers, a value of lattice strain of said at least two semiconductor layers is set at less than a critical strain at which misfit dislocations are generated at an interface between said two adjacent semiconductor layers. In a method for manufacturing a semiconductor device, Al, Ga, In, N, P, As and Sb as materials are prepared as materials for a semiconductor device, and a plurality of semiconductor layers are epitaxially grown by using said materials, including a layer of nitrogen-containing alloy semiconductor $Al_aGa_bIn_{1-a-b}N_xP_yAs_zSb_{1-x-y-z}$ ($0 \leqq a \leqq 1, 0 \leqq b \leqq 1, 0<x<1, 0 \leqq y<1, 0 \leqq z<1$) using nitrogen radical as nitrogen material, in a vacuum of substantially $10^{-2}$ Torr or higher.

13 Claims, 7 Drawing Sheets

OTHER PUBLICATIONS

"Red Shift of Photoluminescence and Absorption in Dilute GaAsN Alloy Lasers" by Markus Weyers, et al., Jpn. Appl. Phys. vol. 31, pp. L853–855, 1992.*

M. Sagawa, et al., "Advantages of InGaAsP Separate Confinement Layer in 0.98 $\mu$m InGaAs/GaAs/InGaP Strained DOW Lasers for High Power Operation at High Temperature", Electronics Letters, vol. 28, No. 17, pp. 1639–1640.*

C. Zah, et al., "High–Performance Uncooled 1.3–$\mu$m $Al_xGa_yIn_{1-x-y}As$/InP Strained–layer Quantum–Well Lasers for Subscriber Loop Applications", IEEE Journal of Quantum Electronics, vol. 30, No. 2, pp. 511–523.*

M. Kondow, et al., "A Novel Material of GaInNAs for Long–Wavelength–Range Laser Diodes with Excellent High–Temperature Performance", Extended Abstract of the 1995 Int'l. Conference on Solid State Devices and Materials, pp. 1016–1018.*

* cited by examiner

| HIGH REFRACTIVE INDEX MATERIALS | LOW REFRACTIVE INDEX MATERIALS |
|---|---|
| GaP | AℓP |
| $GaN_{0.03}P_{0.97}$ | $AℓN_{0.04}P_{0.96}$ |
| GaP | $AℓN_{0.07}P_{0.93}$ |
| $GaN_{0.07}P_{0.93}$ | AℓP |
| $GaP/GaN_{0.04}P_{0.96}$ SUPERLATTICE | $AℓP/AℓN_{0.08}P_{0.94}$ SUPERLATTICE |
| Si | $AℓN_{0.04}P_{0.96}$ |
| Si | AℓP |
| Si | ZnS |

FABRICATION METHOD FOR ALGAINNPASSB BASED DEVICES

Matter enclosed in heavy brackets [ ] appears in the original patent but forms no part of this reissue specification; matter printed in italics indicates the additions made by reissue.

This application is a Divisional application of application Ser. No. 08/381,418, filed Jan. 31, 1995, now abandoned.

BACKGROUND OF THE INVENTION

The semiconductor technology has advanced centering around silicon. The scale of integration has increased from transistor devices to IC (integrated circuit) and VLSI (very large scale integrated circuit), and the increase in scale of integration is expected to continue in the future. With an increase in scale of integration, however, it is feared that corresponding increases in the operation speed is limited by the delay of electric signal through wiring. As the countermeasure for this, optical interconnections are drawing attention, and the monolithic integration of silicon based electronic devices with III–V compound semiconductor optical devices is considered the important basic technique whereby to realize optical interconnections.

For use in forming the III–V compound semiconductor optical devices on a Si substrate, the following two methods are being studied. One is the so-called super-heteroepitaxial method for epitaxially growing a III–V compound semiconductor, such as GaAs or InP, which differs in lattice constant from Si, on a Si substrate, and forming an optical semiconductor of an AlGaAs, InGaAs or other system formed on top of the grown III–V compound semiconductor. An example of this method is disclosed in "Gallium arsenide and other compound semiconductors on silicon" by S. F. Fang, K. Adomi, S. Iyer, H. Morkoc, and H. Zabel in J. Appl. Phys. 68(7), Oct. 1, 1990.

The other is a direct bonding method in which optical semiconductors are first grown on a GaAs or InP substrate and then bonded to a Si substrate, and then the GaAs or InP substrate is removed. Such direct bonding method is disclosed in "Semiconductor lasers on Si substrates using the technology of bonding by atomic rearrangement" by Y. H. Lo et al., Appl. Phys. lett. Vol. 62, pp 1038–1040, 1993.

Regarding the materials used to date for the III–V compound semiconductors, as written in H. C. Casey, Jr. and M. B. Panish, "Heterostructure Lasers—Part B", Academic Press, New York, 1978, pp. 8–9, binary compound semiconductors made up of Al, Ga or In as a group III element and P, As or Sb as a group V element, and alloy semiconductors including those elements have long been used. With progress of the crystal growth techniques, N-containing alloy semiconductors have recently come to be formed, such as GaNP (J. N. Baillargeon, K. Y. Cheng, G. E. Holfer, P. J. Pearch, and K. C. Hsieh, Appl. Phys. Lett. Vol. 60 pp. 2540–2542, 1992) and GaNAs (M. Weyers, M. Sato and H. Ando, Jpn. J. Appl. Phys. Vol. 31, 1992, pp. L853–L855). This has widened the range of choice of materials. In addition, a case where the N-containing alloy semiconductors are grown epitaxially on Si substrates is disclosed in JP-A-1-211912. When an N-containing alloy semiconductor is actually applied to form a semiconductor device like a laser diode, it is necessary to design a multi-layer structure by calculating the band gap and the amount of lattice strain. Because the N-containing alloy semiconductors show a huge bowing occurring in the band gap owing to N's extremely high electro-negativity, which will be described later, such special consideration which is not needed for the conventional alloy semiconductors is required in designing the band gap of the multi-layer structure of the N-containing alloy semiconductors. However, in all the cases of the N-containing alloy semiconductors grown to date, only an epitaxial monolayer is grown on the substrate crystal and, therefore, there has never been a case where N-containing alloy semiconductors are deposited in a multi-structure and applied to form semiconductor devices.

Both in the super-heteroepitaxial method and the direct bonding method, the lattice constant of the materials constituting the optical semiconductor device differs greatly (more than 4%) from that of the Si substrate, so that there is a problem that a misfit dislocation occurs in the crystal near the interface between the Si substrate and the III–V compound semiconductor. Another problem is that due to the difference in thermal expansion coefficient between the Si substrate and the III–V compound semiconductor, the dislocations, which have been generated in the cooling process after a heating process in the epitaxial growth or the bonding, move and increase. As a result, there are problems regarding the characteristics and the device lifetime of the optical semiconductor device produced. Therefore, the monolithic integration of silicon based electronic devices with the III–V compound semiconductor optical devices has not been put into practical application.

SUMMARY OF THE INVENTION

An object of the present invention is to provide a semiconductor device of a multi-layer structure free of misfit dislocations, fabricated from a nitrogen-containing alloy semiconductor and also provide a method for manufacturing this semiconductor device.

Another object of the present invention is to provide an optical semiconductor device which can be manufactured by growing a III–V alloy semiconductor on a Si substrate.

A further object of the present invention is to monolithically integrate silicon based electronic devices and optical semiconductor devices fabricated of III–V alloy semiconductors on the substrate.

In the semiconductor device according to the present invention, a semiconductor device includes a plurality of semiconductor layers. The plurality of semiconductor layers include at least a layer of N-containing alloy semiconductor of $Al_aGa_bIn_{1-a-b}N_xP_yAs_zSb_{1-x-y-z}$ ($0 \leqq a \leqq 1$, $0 \leqq b \leqq 1$, $0<x<1$, $0 \leqq y<1$, $0 \leqq z<1$). In at least two semiconductor layers of the plurality of semiconductor layers, each semiconductor layer has the value of lattice strain thereof set at less than the critical strain at which misfit dislocations are generated at the interface between this semiconductor layer and a semiconductor layer adjacent thereto. In the manufacturing method of semiconductor devices according to the present invention, Al, Ga, In, N, P, and As are prepared as materials for semiconductor devices, and a plurality of semiconductor layers including a layer of the N-containing alloy semiconductor $Al_aGa_bIn_{1-a-b}N_xP_yAs_zSb_{1-x-y-z}$ ($0 \leqq a \leqq 1$, $0 \leqq b \leqq 1$, $0<x1$, $0 \leqq y<1$, $0 \leqq z<1$) are grown epitaxially using nitrogen radical as nitrogen material in a vacuum of substantially $10^{-2}$ Torr or higher vacuum.

Still other objects and effects of the present invention will become apparent from the following detailed description of embodiments with reference to the accompanying drawings.

DESCRIPTION OF THE PREFERRED EMBODIMENTS

In embodiments of the present invention, the optical semiconductor device is manufactured such that the lattice strain of each semiconductor layer as a material for the optical semiconductor device is kept lower than the critical strain which causes a misfit dislocation, in the whole temperature range of the manufacturing process. When the total thickness of the strained layers exceeds the critical thickness, it is necessary to compensate the stress and use an N-containing alloy semiconductor of AlGaInNPAsSb to form the layer having tensile strain. The strained layer of AlGaInNPAsSb, as there is difficulty in its production, should preferably have a thickness of 2 nm or more, and the lattice mismatch should be less than ±4% in relation to the critical thickness. For example, in the case of GaN(x)As(1−x), the range of the alloy composition x of $0.02<x<0.36$ is recommended.

Description will be made of the devices constituting an optoelectronic integrated circuit (OEIC) according to the present invention.

Figures 2, 3:
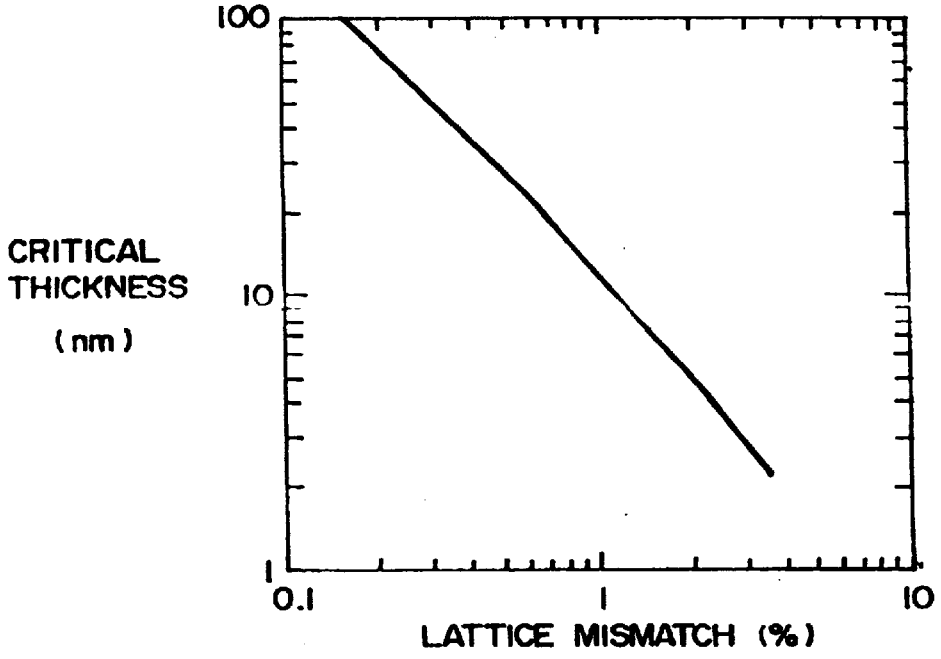
FIG. 2 is a table of materials for a multi-layer film mirror applicable in the optical semiconductor apparatus in the present invention.
FIG. 3 is a diagram showing the relation between the lattice mismatch and the critical thickness of the semiconductor layer.

When a light emitting diode is a laser diode (LD), a strained layer of a direct transition type N-containing alloy semiconductor of AlGaInNPasSb is used for the active layer.. When the strained layers are to be grown to a total thickness larger than the critical thickness, the stress is offset by depositing a layer having a tensile strain on top of a layer having a compressive strain or depositing a layer having a compressive strain on top of a layer having a tensile strain. To improve the carrier injection efficiency, it is only necessary to place a guide layer made of Al(a)Ga(1−a)N(x)P(1−x) ($0\leqq a\leqq 1$, $0\leqq x\leqq 1$), Si adjacent to the active layer. When the lasing wavelength is longer than the band gap of Si, the Si can be used as the material for the clad layer or guide layer. When a laser diode is of a surface emitting type, as shown in FIG. 2, GaP, AlP, GaNP, AlNP, Si or a II–VI semiconductor such as ZnS is used as the material for a high-quality multi-layer film mirror.

When a light detector is a photodiode (PD), to reduce the band gap to expand the detecting wavelength range, an N-containing alloy semiconductor of AlGaInNPAsSb should be used as the material for the light absorbing layer. When the photodiode is an avalanche photodiode, a Si material having a large difference in ionization coefficient between electrons and holes can be used for the multiplication layer.

If an N-containing alloy semiconductor of AlGaInNPAsSb with a narrow band gap of 0.5 eV or less or with a nature of a semimetal is used for the electrode contact layer, a good quality ohmic electrode can be formed. It ought to be noted that the electrode contact layer of N-containing alloy semiconductor is used widely not only in optical devices but also in electronic devices. For the electrode contact layer, silicon is also used regardless of whether it is monocrystal or polycrystal. When the wavelength of light used with the optical semiconductor device is transparent to Si, the Si electrode functions as a transparent electrode.

The N-containing alloy semiconductor of AlGaInNPAsSb can be grown epitaxially to obtain a good-quality crystal without occurrence of misfit dislocations, by using nitrogen radical as the material for N content in a greater vacuum than $10^{-2}$ Torr. For the AlGaInNPAsSb semiconductor, C or Be is used as the p-type impurity and Si or Sn is used as the n-type impurity.

If the wavelength of light used with the optical semiconductor device in an optoelectronic integrated circuit is transparent to Si, an optical circuit can be formed using Si and can be formed in an Si substrate, too. The optical circuit can be fabricated in a layer structure, and when a signal is transmitted to multiple points like a clock signal, a light waveguide need not be formed in the layer structure.

The problem that dislocations are generated when the lattice constant of the material of the optical semiconductor differs greatly from that of Si can be solved by controlling the thickness of the semiconductor layers constituting the optical semiconductor device. FIG. 3 shows the relation between critical thickness and lattice mismatch calculated according to Matthews' theory. From FIG. 3, it is understood that the critical thickness is 10 nm for a layer with 1% lattice mismatch and 2 nm for a layer with 4% lattice mismatch. For example, GaAs has a lattice mismatch of about 4% to Si and the critical thickness for GaAs is 2 nm, so that GaAs cannot be grown to a thickness of larger than 2 nm without generating dislocations. Of the conventional alloy semiconductors made of group III elements of Al, Ga or In and group V elements of P, As or Sb, an alloy semiconductor which is a direct transition type and has a lattice constant closest to that of Si is $GaAs_{0.5}P_{0.5}$, and from its lattice mismatch of 2%, it is known that the critical thickness is 4 nm. When the strained layers are to be grown to a total thickness larger than the critical thickness, it is necessary to control the total strain so as to be less than the critical strain through stress compensation by depositing a layer having a compressive strain on top of a layer having a tensile strain to have the compressive strain and the tensile strain offset each other. However, the conventional alloy semiconductors made of group III elements of Al, Ga or In, and group V elements of P, As or Sb, having the lattice constant greater than that of Si, cannot be used to form layers having tensile strain. With the N-containing alloy semiconductors of AlGaInNPAsSb, the manufacture of which has recently become possible, by selecting an alloy composition, they can be made to have lattice constant smaller than that of Si; and if an N-containing alloy semiconductor is used as a layer having tensile strain on a layer having compressive strain, the stress compensation can be achieved. A superlattice layer, in which the stress has been compensated to reduce the total strain to zero and is substantially lattice-matched to the Si substrate, offers no chances of misfit dislocations.

Figure 4:
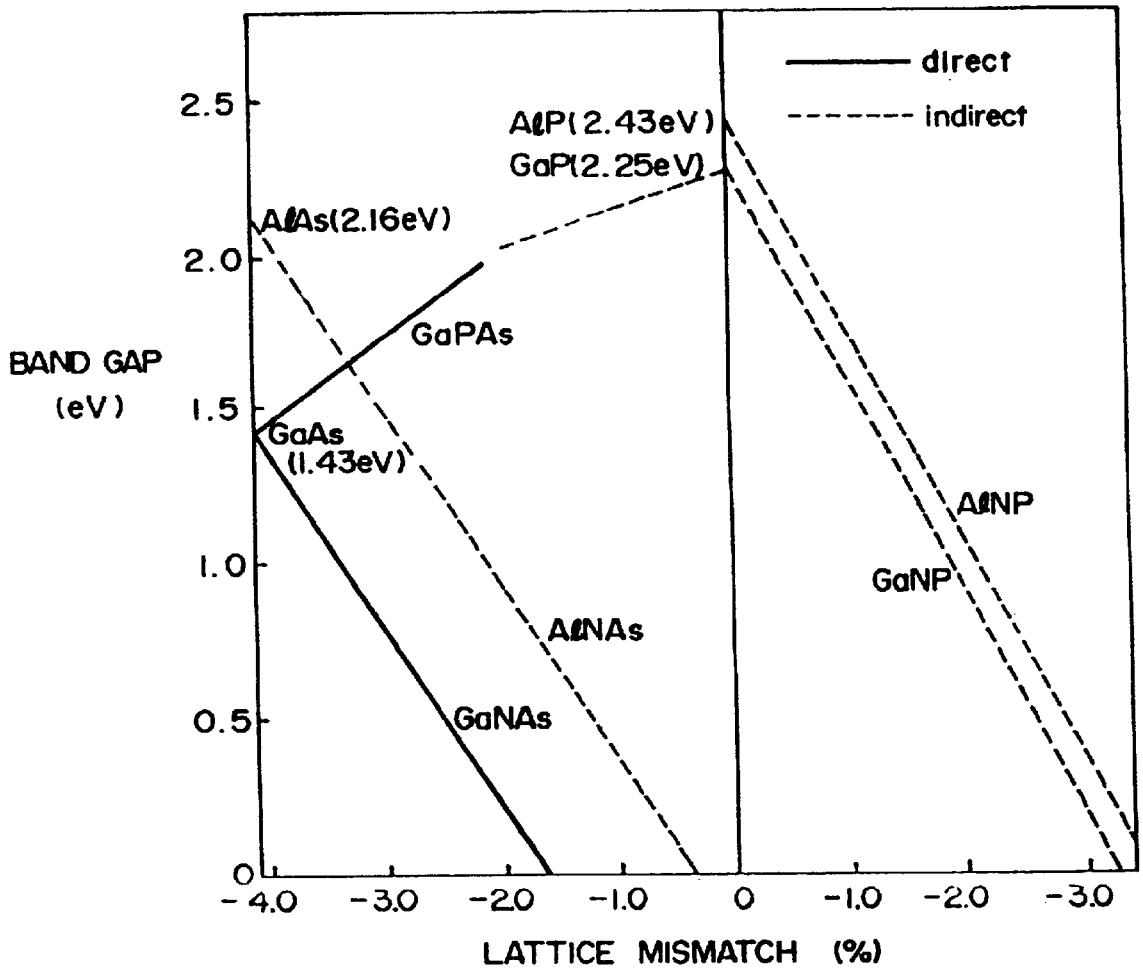
FIG. 4 is a diagram showing the relation between the lattice mismatch and the band gap between GaNAs, GaNP, AlNAs, AlNP and GaPAs, and the Si substrate.

With the N-containing alloy semiconductors, owing to the extremely high electro-negativity of N, a huge bowing occurs in the band gap. To show an example, as the N content which is added to GaAs and GaP is increased, their band gaps gradually decrease and do not increase toward the GaN bandgap of 3.4 eV. This is different from the tendency of the band gaps of the conventional alloy semiconductors. A compound semiconductor of $GaN_{0.19}As_{0.81}$ lattice matched to Si has the band gap reduced to 0 and becomes a semimetal. FIG. 4 shows the relation between the lattice mismatch of GaNAs, GaNP, AlNAs, AlNP and GaPAs to the Si substrates and the band gap. For example, if a superlattice layer is formed by alternately depositing $GaP_{0.25}As_{0.75}$ layers each with a +3% lattice mismatch at 1 nm thickness and $AlN_{0.05}P_{0.95}$ layers each with a −0.6% lattice mismatch at 5 nm thickness, the total strain is reduced to 0 and the band gap becomes substantially 2.0 eV. A superlattice layer with the total strain reduced to 0, formed by alternately depositing $GaN_{0.1}As_{0.9}$ layers each with a +2% lattice mismatch at 3 nm thickness and $GaN_{0.14}P_{0.86}$ layers each with a −2% lattice mismatch at 3 nm thickness, has a band gap of substantially 0.5 eV. As has been described, the band gap can be designed freely to have a band gap from 2 to 0 eV with the total strain kept to 0 by selecting the kinds of semiconductors to form a superlattice layer. In the above description, Si is used for the substrate crystal, but a superlattice layer with the total strain reduced to 0 by stress compensation can be produced by using a GaP or AlP substrate crystal with a lattice constant substantially equal to that of Si.

Figure 5:
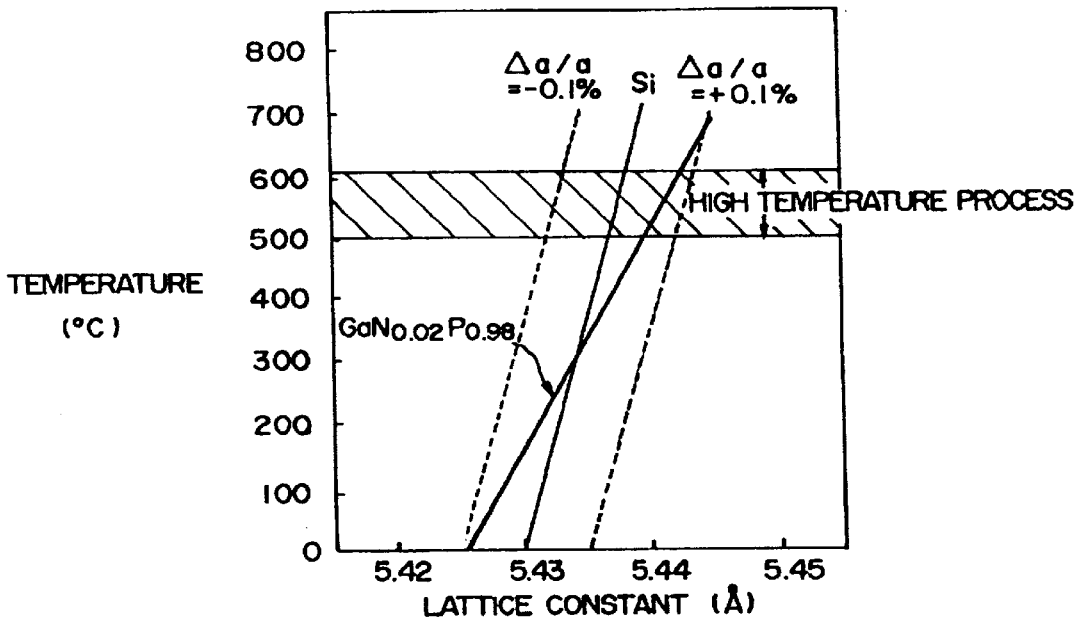
FIG. 5 is a diagram showing the relation between the lattice constant and temperature for Si and GaNP.

Let us consider the difference in thermal expansion coefficient between Si and III–V compound semiconductors. Since the thermal expansion coefficient of Si is $2.6\times10^{-6}$/° C. and the thermal expansion coefficient of GaAs is $6.0\times10^{-6}$/° C., if GaAs and Si are cooled from a high temperature process at 630° C. to a room temperature of 30° C., a thermal strain of 0.2% occurs. From FIG. 3, the critical thickness is estimated at 80 nm. According to Matthews' theory, when the lattice mismatch is small, the critical thickness tends to be estimated at smaller values. Nevertheless, this thermal strain is a problem when a device several μm thick is produced. When a layer is grown to a thickness of 0.1 μm or more, if the lattice mismatch is constrained to less than ±0.1%, dislocations are hardly generated. To this end, it is necessary to select the composition of the layer so as to be lattice matched to Si as shown in FIG. 5, and set the temperature for lattice matching at a temperature between room temperature and the temperature of the high temperature process. Note that the above-mentioned layer with a thickness of 0.1 μm or more may be a layer of a single composition or a superlattice layer with the total strain reduced to 0 by stress compensation as mentioned above.

Illustrative embodiments of the semiconductor device according to the present invention will be described.

EMBODIMENT 1

Figure 1A:
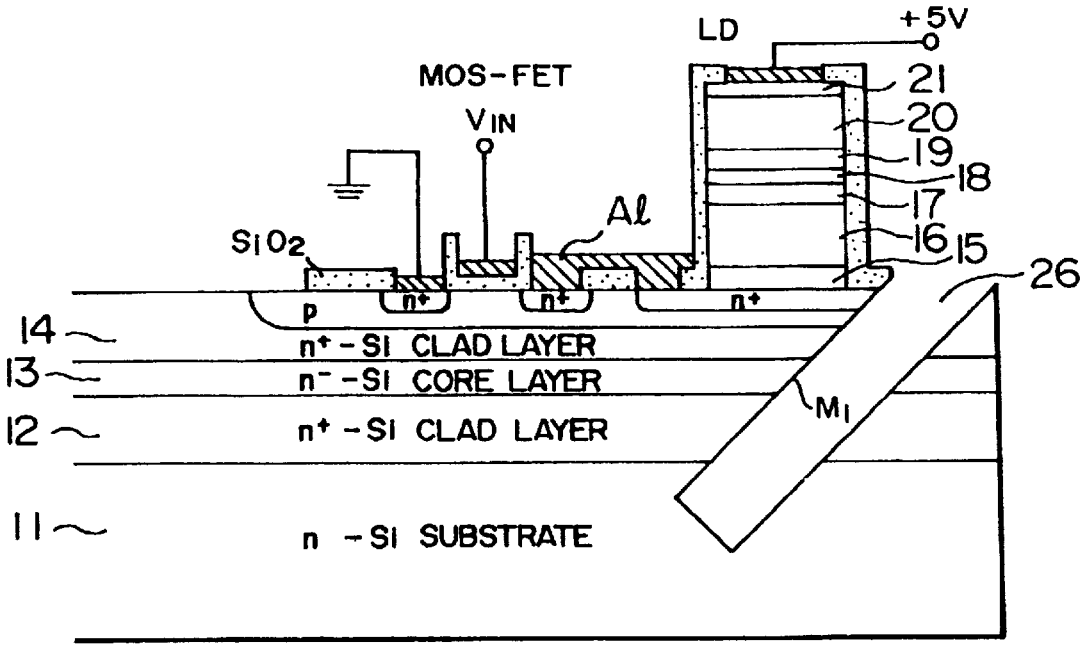
FIGS. 1A and 1B are enlarged schematic sectional views of an embodiment of an optical semiconductor apparatus formed by monolithic integration of group III–V optical semiconductor devices and Si based electronic devices.
Figure 1B:
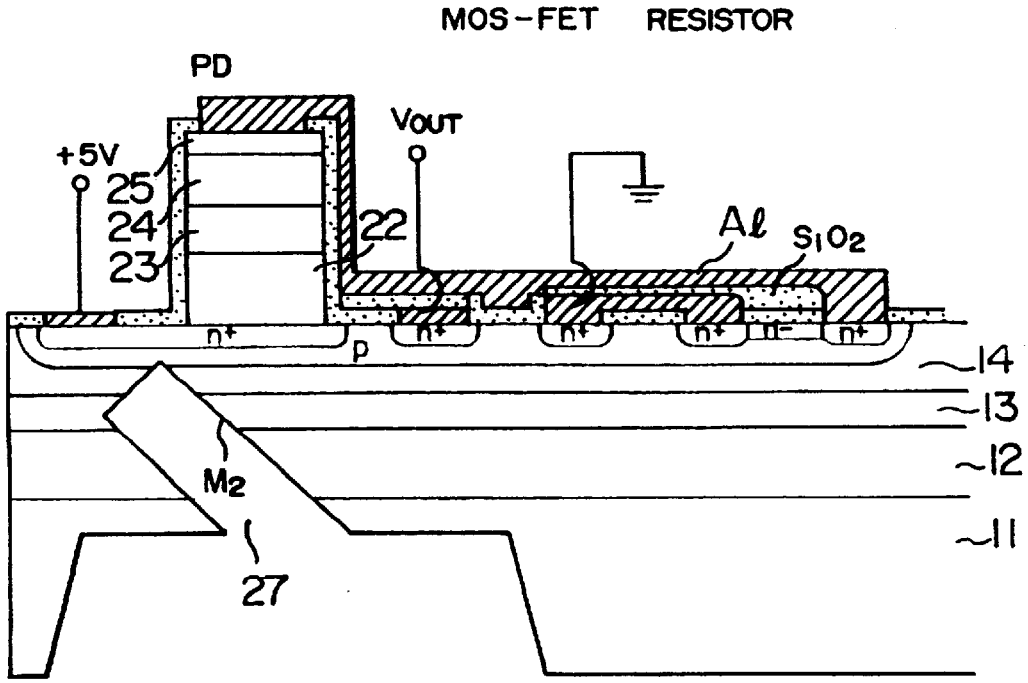

In this embodiment, an opto-electronic integrated circuit (OEIC) was formed by integrating 10,000 Si-based electronic devices such as MOS-FETs (metal-oxide-semiconductor field-effect transistors), 100 surface emitting diodes of III–V alloy semiconductors, and 100 PIN photodiodes of III–V alloy semiconductors on the same Si substrate. FIGS. 1A and 1B are sectional views of the structure of the OEIC. FIG. 1A shows a surface emitting laser diode LD integrated with a MOS-FET and FIG. 1B shows a PIN photodiode integrated with a MOS-FET and a resistor. In this OEIC, the electric circuit is formed on the surface of a Si substrate 11, and optical circuits 12, 13 and 14 are formed in the Si substrate 11, so that the electric circuit and the optical circuits are spatially separated. The spatial separation of the electric and optical circuits enables electric and optical circuits to be installed independently, thus offering a great number of degrees of freedom in circuit configuration.

The method for forming this OEIC will be described. Description will start with the method for forming the optical circuits. In FIG. 1, reference numeral 11 denotes an n-type (111) Si substrate, and grown epitaxially on top of this Si substrate are an n-type Si layer 12 ($n=1\times10^{18}$ $cm^{-3}$, d=1 μm) as a clad layer for the light waveguide and an n-type Si layer 13 ($n=1\times10^{15}$ $cm^{-3}$, d=1 μm) as a core layer. When forming a light waveguide in the surface of the core layer, phosphorus ions are introduced into the core layer on the left and right sides of the region used as the core such that $n=1\times10^{18}$ $cm^{-3}$ on either side, and the thus doped regions on either side of the core are as the clad layers. After the light waveguide has been formed, an n-type Si layer 14 ($n=1\times10^{18}$ $cm^{-3}$, d=3 μm) is grown on the core layer 13, so that a three-dimensional light waveguide is formed. When a signal is sent to a number of points like a clock signal, the light waveguide need not be formed in the surface of the core layer. In this embodiment, only one core layer is formed, but it is possible to form more than one core layer, and configure the optical circuits freely.

As a preparatory step prior to forming an electronic device, ions are implanted into the Si substrate in which a light waveguide has been formed. As shown in FIGS. 1A and 1B, boron ions are implanted to form a p-type region of high resistivity for isolation purposes. Phosphorus ions are implanted to form a contact layer of an n-type group III–V optical semiconductor device, source and drain electrodes of the MOS-FET, a resistor and so on are formed.

Next, a group III–V optical semiconductor device is formed by selective layer growth. The surface emitting laser diode LD is 5 μm in diameter. In FIG. 1A, reference numeral 15 denotes an n-type $GaN_{0.03}P_{0.97}$ buffer layer ($n=1\times10^{18}$ $cm^{-3}$, d=0.1 μm), 16 denotes an n-type semiconductor multi-layer film mirror ($n-1\times10^{18}$ $cm^{-3}$), 17 denotes an n-type $GaN_{0.03}P_{0.97}$ clad layer ($n=1\times10^{18}$ $cm^{-3}$), 18 denotes a non-doped active layer, 19 denotes a p-type $GaN_{0.03}P_{0.97}$ clad layer ($p=1\times10^{18}$ $cm^{-3}$), 20 denotes a p-type semiconductor multi-layer film mirror ($p=1\times10^{19}$ $cm^{-3}$, and 21 denotes a semimetal $GaN_{0.19}As_{0.81}$ contact layer (d=0.1 μm). For the active layer 18, a stress compensated strained superlattice layer which permits the band gap to be set freely for a range of 2 to 0 eV is used, but because silicon (Eg=1.1 eV) as the material for the optical circuit must be transparent, in this embodiment, a stress compensated superlattice layer with a band gap of substantially 0.8 eV (wavelength: 1.55 μm) was used which was formed by alternately depositing $GaN_{0.07}P_{0.93}$ layers each with a −1% lattice mismatch at 2 nm thickness and $GaN_{0.10}As_{0.90}$ layers each with a +2% lattice mismatch at 1 nm thickness. The thickness of this superlattice layer was d=100 nm obtained by repeating layer deposition for 33 periods so that the thickness is about ¼ of the wavelength in the semiconductor.

In order to realize a 1-wavelength cavity, the thicknesses of the clad layers 17 and 19 were both made ⅜ of the wavelength in the semiconductor so that the distance between mirrors 16 and 20 is 1 wavelength. The semiconductor multi-layer film mirrors 16, 20 are each formed by alternately depositing high-refractive-index $GaN_{0.03}P_{0.97}$ layers each ¼ wavelength thick in the semiconductor and low-refractive-index $AlN_{0.04}P_{0.96}$ layers each ¼ wavelength thick in the semiconductor. In order to obtain the reflectance of 99% or more, the mirror layers 16, 20 were formed by repeating layer deposition 20 times. The mirror layers 16, 20 are formed by alternately depositing layers of high and low refractive indexes and, to this end, for example, the materials given in FIG. 2 may be used. For the p-type mirror layer 20, doping is performed at a high concentration of $p=1\times10^{19}$ $cm^{-3}$ to reduce the resistivity. Description will now proceed to the PIN photodiode PD. The PIN photodiode PD is 5 $\mu$m in diameter. In FIG. 1B, reference numeral 22 denotes an n-type $GaN_{0.03}P_{0.97}$ layer ($n=2\times10^{18}$ $cm^{-3}$, d=1.0 $\mu$m), 23 denotes a non-doped stress compensated superlattice layer ($n=1\times10^{15}$ $cm^{-3}$, d=0.5 $\mu$m) having an effective band gap of 0.5 eV, formed by alternately depositing $Ga_{0.14}P_{0.86}$ layers each with a −2% lattice mismatch at 2 nm thickness and $GaN_{0.10}As_{0.90}$ layers each with a +2% lattice mismatch at 2 nm thickness, 24 denotes a p-type $Ga_{0.03}P_{0.97}$ layer ($p=2\times10^{18}$ $cm^{-3}$, d=1.0 $\mu$m), and 25 denotes a semimetal $Al_{0.50}Ga_{0.50}N_{0.19}As_{0.81}$ contact layer (d=0.1 $\mu$m). The layers constituting the surface emitting diode LD and the PIN photodiode PD were formed by growing crystals in a high vacuum of $1\times10^{-6}$ Torr continuously in a gas source molecular beam epitaxial system. In growing Si layers, a polysilicon was used as the material, and Sb was used to provide an n-type dopant. In growing the III–V compound semiconductors, metal elements were used as group III materials, and phosphine and arsine were used as the materials for P and As, and as nitrogen material, nitrogen radical was obtained by activating nitrogen molecules by radio frequency plasma. Si and C (neopentane) were used respectively to obtain the n-type and p-type dopants. The growth temperature was 500° C., and the stress compensated superlattice layers and the single-composition layers were designed to be all lattice matched to the Si substrate at 300° C. Therefore, the lattice mismatch with Si can be maintained to be less than 0.1% for the entire temperature range of the manufacturing process.

The Si wafer on which the group III–V optical semiconductor devices have been formed are coated with an $SiO_2$ oxide film for use under the gate electrode of the MOS-FET and also for protection of the surfaces of the group III–V optical semiconductor devices LD and PD. Then, the thus formed optical semiconductor devices and electronic devices are provided with metal interconnection circuits by multi-layer wiring using Al and $SiO_2$.

Finally, to form mirrors M1 and M2 in the optical circuits, grooves 26 and 27 are cut, which is tilted 45° to the surface of the Si substrate, by a halogen-applied reactive ion beam, by which step the OEIC is completed. The grooves can be made in an easier direction of work whether from the top or bottom side of the substrate.

The operation principle of the OEIC will next be described. When a voltage $V_{IN}$ is applied to the gate electrode of the MOS-FET for driving the laser diode LD, a current is conducted into the surface emitting laser diode LD, and the laser diode LD oscillates. The laser beam is radiated into the substrate, then totally reflected by the 45° inclined mirror M1, and guided to the light waveguide 13. The guided laser beam is totally reflected again by the other mirror M2 and guided to the photodiode PD. The detected laser beam is converted by the photodiode PD into a current, and this current is converted by the resistor into a voltage, and this voltage is amplified by the MOS-FET, and finally a voltage $V_{out}$ is output to the source electrode.

EMBODIMENT 2

Figure 6A:
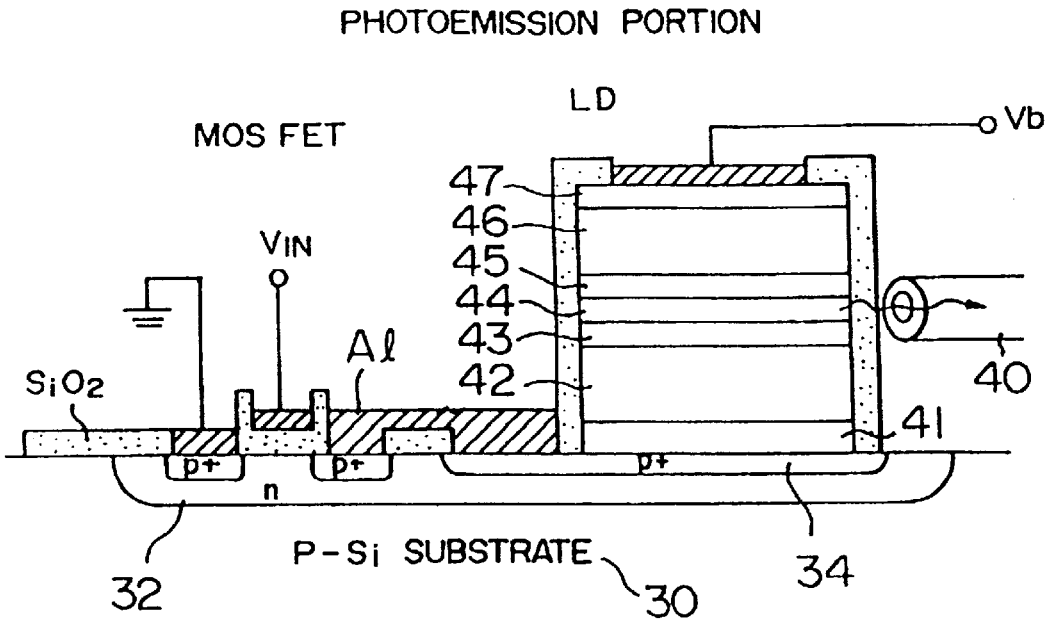
FIGS. 6A and 6B are enlarged schematic sectional views of another embodiment of the optical semiconductor apparatus formed by monolithic integration of group III–V optical semiconductor devices and Si based electronic devices according to the present invention.
Figure 6B:
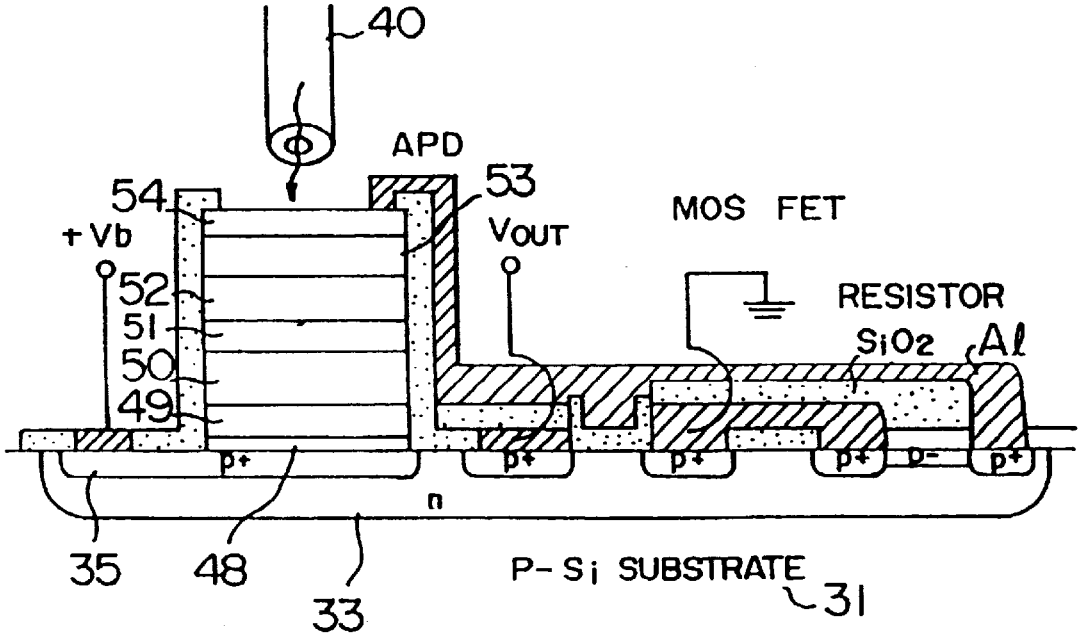

FIGS. 6A and 6B are sectional views of the structure of another embodiment of the OEIC to which the present invention is applied. FIG. 6A shows a photoemitter portion having a Si MOS-FET and a surface emitting laser diode LD integrated on a Si crystal substrate 30, while FIG. 6B shows a photodetector portion having a Si-MOS FET, a resistor, and an avalanche photodiode APD integrated on another Si crystal substrate 31. The photoemitter portion and the photodetector portion, connected by an optical fiber 40, are used for signal transmission between IC chips. Description will start with the manufacturing method. Ion implantation will be performed on the p-type (511) Si substrates 30, 31 as a preparatory step for fabricating electronic devices. As shown in FIGS. 6A and 6B, to provide isolation regions, phosphorus ions are implanted to form n-type regions 32, 33 of high resistivity, and boron ions are implanted to form contact layers 34, 35 of p-type group III–V optical semiconductor devices, source and drain electrodes of MOS-FETs, and a resistor. Then, the group III–V optical semiconductor devices LD and APD are formed by selective growth. The structure of the surface emitting laser diode LD will be described. In FIG. 6A, reference numeral 41 denotes a p-type $GaN_{0.03}P_{0.97}$ buffer layer ($p=1\times10^{18}$ $cm^{-3}$, d=0.1 $\mu$m), 42 and 46 respectively denote p-type and n-type $AlN_{0.04}P_{0.96}$ clad layers (p, $n=1\times10^{18}$ $cm^{-3}$, d=1.0 $\mu$m), 43 and 45 denote p-type and n-type AlGaNP guide layers (p, $n=5\times10^{17}$ $cm^{-3}$, d=0.30 $\mu$m) of so-called GRIN (Graded-Refractive-Index) structure having the band gap parabolically varied by varying the Al composition, 44 denotes a stress-uncompensated non-doped quantum well active layer (wavelength: 1.24 $\mu$m) formed by alternately depositing for 2.5 periods $GaN_{0.03}P_{0.97}$ barrier layers each with a 0% lattice mismatch at 10 nm thickness and $GaN_{0.10}As_{0.90}$ well layers each with a +2% lattice mismatch at 1.5 nm thickness, and 47 denotes a Si contact layer ($n=1\times10^{19}$ $cm^{-3}$, d=0.1 $\mu$m). To produce a cavity, mirrors are formed by etching in the vertical direction using a halogen-applied reactive ion beam, by which step a laser diode is completed. The cavity is 300 $\mu$m long. The structure of the avalanche photodiode APD will next be described. The diameter of the avalanche photodiode is 10 $\mu$m. In FIG. 6B, 48 denotes a p-type GaP buffer layer ($p=2\times10^{18}$ $cm^{-3}$, d=0.01 $\mu$m), 49 denotes a p-type $GaN_{0.03}P_{0.97}$ buffer layer ($p=2\times10^{18}$ $cm^{-3}$, d=1.0 $\mu$m), 50 denotes an n-type stress-compensated super-lattice light absorption layer ($p=1\times10^{15}$ $cm^{-3}$, d=0.3 $\mu$m) having a band gap of substantially 0.8 eV, formed by alternately depositing $GaN_{0.07}P_{0.93}$ layers each with a −1% lattice mismatch at 2 nm thickness and $GaN_{0.10}As_{0.90}$ layers each with a +2% lattice mismatch at 1 nm thickness, 51 denotes an n-type Si electric buffer layer ($n=2\times10^{17}$ $cm^{-3}$, d=0.05 $\mu$m), 52 denotes an n-type Si multiplication layer ($n=2\times10^{15}$ $cm^{-3}$, d=0.1 $\mu$m), 53 denotes an n-type Si cap layer ($n=2\times10^{18}$ $cm^{-3}$, d=1.0 $\mu$m) and 54 denotes an n-type Si contact layer ($n=2\times10^{19}$ $cm^{-3}$, d=1.0 $\mu$m).

The layers constituting the laser diode LD and the avalanche photodiode APD were formed by growing crystals in a high vacuum of $1\times10^{-5}$ Torr in an chemical beam epitaxial system. In growing Si layers, a polysilicon was used as the material, and Sb and B were used respectively to provide the n-type and p-type dopants. In growing the III–V semiconductor layers, ethyl-based organometallic compounds were used as group III materials, and phosphine and arsine were used as materials for P and As, and nitrogen was obtained by activating ammonia molecules by ECR plasma. Sn and Be were used to provide the n-type and p-type dopants. The crystal growth was performed at 400° C., and the stress compensated superlattice layer and the single-composition layers were all designed to be lattice matched to Si at 300° C. The Si wafers 30 and 31 on which the group III–V optical semiconductor devices have been formed are coated with a $SiO_2$ film for protection of the surfaces of the group III–V optical semiconductor devices LD and APD and also for use under the gate electrode of the MOS-FET. Then, the optical semiconductor devices and electronic devices thus formed are provided with metal interconnection circuits by multi-layer wiring using Al and $SiO_2$.

The operation principle of this OEIC will now be described. When a voltage $V_{in}$ is applied to the gate electrode of the MOS-FET for driving the laser diode LD, a current is supplied into the surface emitting laser diode LD, and the laser oscillates. The laser beam is introduced into an optical fiber 40, and the introduced laser beam is guided into the avalanche photodiode APD. The detected laser beam is converted by the photodiode APD into a current, this current is converted by the resistor into a voltage, this voltage is amplified by the MOS-FET, and is finally output to the source electrode $V_{out}$.

In this embodiment, the photoemitter and the photodetector are formed on the separate substrate crystals, and are used for signal transmission between the IC chips, but like in Embodiment 1 described earlier, the photoemitter and the photodetector may be used for signal transmission within an IC chip by using a light waveguide or an optical fiber.

EMBODIMENT 3

Figure 7:
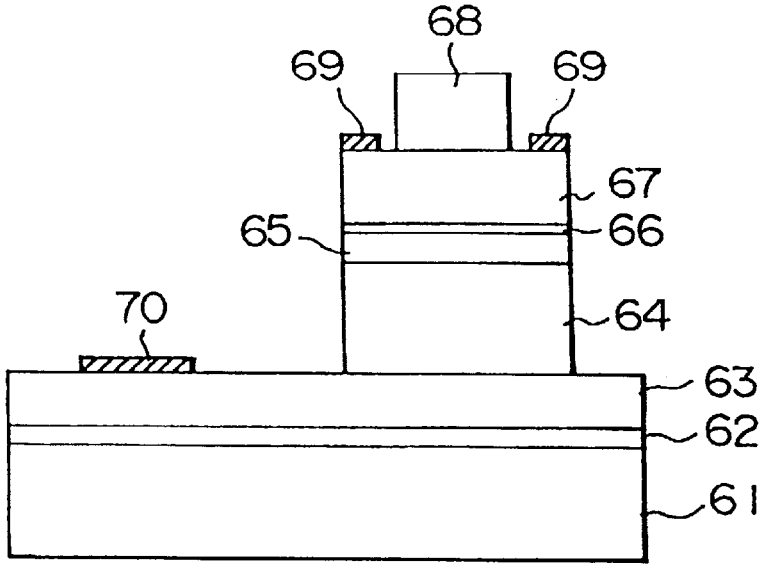
FIG. 7 is an enlarged schematic sectional view of the surface emitting laser diode according to the present invention.

In this embodiment, an independent surface emitting laser diode is formed on a Si substrate. The sectional view of its structure is shown in FIG. 7. The diameter of the surface emitting laser diode is 10 $\mu$m. In FIG. 7 reference numeral 61 denotes an n-type (100) Si substrate ($n=1\times10^{18}$ $cm^{-3}$, d=200 $\mu$m), 62 denotes an n-type GaP buffer layer ($n=1\times10^{18}$ $cm^{-3}$, d=0.01 $\mu$m), 63 denotes an n-type $GaN_{0.03}P_{0.97}$ buffer layer ($n=1\times10^{18}$ $cm^{-3}$, d=0.5 $\mu$m), 64 denotes an n-type semiconductor multi-layer film mirror ($n=1\times10^{18}$ $cm^{-3}$), 65 denotes an n-type Si clad layer ($n=1\times10^{18}$ $cm^{-3}$), 65 denotes an n-type Si clad layer ($n=1\times10^{18}$ $cm^{-3}$), 66 denotes a non-doped active layer, 67 denotes a p-type Si clad layer ($p=1\times10^{18}$ $cm^{-3}$), 68 denotes a dielectric multi-layer film mirror, 69 denotes a p-type electrode, and 70 denotes an n-type electrode. The active layer 66 was formed by a stress compensated superlattice layer having a band gap of substantially 0.8 eV (wavelength: 1.55 $\mu$m), made by alternately depositing $GaN_{0.07}P_{0.93}$ layers each with a −1% lattice mismatch at 2 nm thickness and $GaN_{0.10}As_{0.90}$ layers each with a +2% lattice mismatch at 1 nm thickness. The thickness was d=100 nm by repeating layer deposition for 33 periods so that the thickness is about ¼ of the wavelength in the semiconductor. A 3-wavelength cavity is formed by providing the n-type clad layer 65 whose thickness is ⅜ of the wavelength in the semiconductor and the p-type clad layer 67 whose thickness is 2 and ⅜ wavelengths in the semiconductor. The p-type clad layer 67 is doped to a high concentration of $p=2\times10^{18}$ $cm^{-3}$ to reduce the resistivity. The semiconductor multi-layer film mirror 64 was formed by alternately depositing high-refractive-index $GaN_{0.03}P_{0.97}$ layers each ¼ of the wavelength thick in the semiconductor and low-refractive-index $AlN_{0.04}P_{0.96}$ layers each ¼ of the wavelength thick in the semiconductor. The mirror layers were formed by repeating layer depositing 20 times to achieve a reflectance of 99% or more. The dielectric multi-layer film mirror 68 is formed by alternately depositing high-refractive-index amorphous Si layers each ¼ of the wavelength thick in the dielectric and low-refractive-index $SiO_2$ layers each ¼ of the wavelength thick in the dielectric. To obtain a reflectance of 99% or more, the mirror layers were formed by repeating layer deposition 5 times. Because the dielectric multi-layer film mirror 68 needs to be formed by alternate deposition of high-refractive-index layers and low-refractive-index layers, it is possible to use SiN and $SiO_2$, amorphous Si and SiN, or $TiO_2$ and $SiO_2$. The semiconductor layers 62–67 were formed by growing crystals in a high vacuum of $1\times10^{-7}$ Torr continuously in a gas source molecular beam epitaxial system. In growing Si layers, a polysilicon was used as material, and Sb and B were respectively used as n-type and p-type dopants. In growing the group III–V semiconductors, metals were used to provide group III materials, phosphine and arsine were used to provide P and As, and N atoms were provided as nitrogen radical obtained by activating nitrogen molecules by radio frequency plasma. Si and C (neopentane) were used to provide n-type and p-type dopants. The epitaxial growth was performed at 600° C., and the stress compensated superlattice layer and the single composition layers were all designed to be lattice matched to Si. Therefore, the lattice mismatch to Si can be maintained to be 0.1% or less in the entire temperature range of the manufacturing process. On the wafer on which the crystal growth has been completed, the dielectric multi-layer film is deposited. Next, the device is isolated by etching in the vertical direction using a halogen-applied reactive ion beam as shown in FIG. 7. The diameter of the device is 10 $\mu$m. By finally providing p-type and n-type electrodes 69, 70, the surface emitting laser diode is completed. This laser diode is characterized by its long device life because misfit dislocations do not occur in the vicinity of the interface with the adjacent layers.

EMBODIMENT 4

Figure 8:
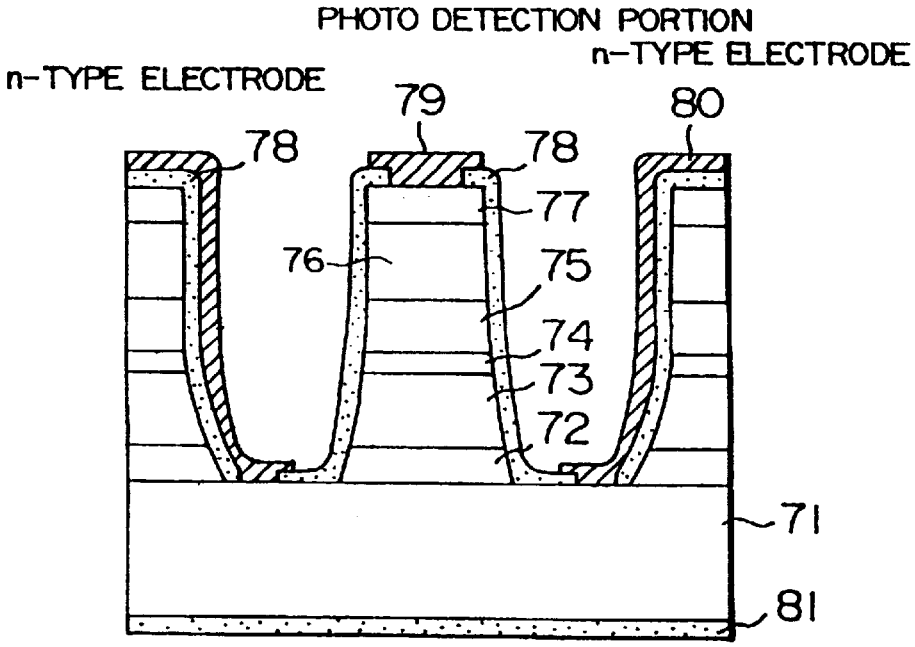
FIG. 8 is an enlarged schematic sectional view of an embodiment of the avalanche photodiode according to the present invention.

In this embodiment, an independent avalanche photodiode was formed on a Si substrate inclined 5 degrees from (100) to the direction of [110]. A detection light is introduced from the rear side of the substrate crystal of this device. FIG. 8 is a sectional view of the structure of this device. In FIG. 8, reference numeral 71 denotes an n-type Si substrate ($n=1\times10^{18}$ $cm^{-3}$, d=200 $\mu$m), 72 denotes an n-type Si buffer layer ($n=1\times10^{18}$ $cm^{-3}$, d=0.5 $\mu$m), 73 denotes a p-type Si multiplication layer ($p=2\times10^{15}$ $cm^{-3}$, d=0.2 $\mu$m), 74 denotes a p-type Si electric field attenuating layer ($p=2\times10^{17}$ $cm^{-3}$, d=0.1 $\mu$m), 75 denotes a non-doped stress compensated superlattice light absorption layer ($p=2\times10^{15}$ $cm^{-3}$, d=0.3 $\mu$m) having a band gap of substantially 0.5 eV, formed by alternately depositing $GaN_{0.1}As_{0.9}$ layers each with a +2% lattice mismatch at 3 nm thickness and $GaN_{0.14}P_{0.86}$ layers each with a −2% lattice mismatch at 3 nm thickness), 76 denotes a p-type $GaN_{0.03}P_{0.97}$ cap layer ($p=2\times10^{18}$ $cm^{-3}$, d=1.0 $\mu$m), 77 denotes a p-type Si contact layer ($p=2\times10^{19}$ $cm^{-3}$, d=0.1 $\mu$m), 78 denotes a polyimide insulating protective layer, 79 denotes a p-type electrode, 80 denotes an n-type electrode, and 81 denotes a nonreflective layer. The semiconductor layers 72–77 were formed by growing crystals continuously in a high vacuum of $1\times10^{-7}$ Torr in a gas source molecular beam epitaxial system. In growing Si layers, a polysilicon was used as source material, and Sb and B were used to provide n-type and p-type dopants. In the growth of group III–V semiconductor layers, metals were used to provide group III materials, phosphine and arsine were used as materials for P and As, and as nitrogen material, nitrogen radical was used which was obtained by activating nitrogen molecules by radio frequency plasma. Si and C (neopentane) were used to provide n-type and p-type dopants. The crystal growth is performed at 600° C., and the stress compensated superlattice layer and the single composition layers are all designed to be lattice matched to Si at 300° C. Therefore, the lattice mismatch to Si can be maintained at 0.1% or less in the entire temperature range of the manufacturing process. The wafer on which the crystal growth has been completed is now subjected to wet etching to separate the device as shown in FIG. 8 in order to form the photodetector portion 50 $\mu$m in diameter and the n-type electrode portions. Then, the insulating protective layer 78 is formed by polyimide, and the n-type electrodes 80 and the p-type electrode 79 are vapor-deposited. Finally, the rear side of the substrate crystal is coated with a nonreflective film 81 using SiN. This avalanche photodiode is capable of detecting a long-wavelength light up to about 2.5 $\mu$m long owing to the band gap of 0.5 eV in the light absorbing layer, and is also capable of high multiplication because a silicon with a great difference in ionization coefficient between electrons and holes is used to form the multiplication layer. Furthermore, no generation of misfit dislocations ensures a long device lifetime.

EMBODIMENT 5

Figure 9:
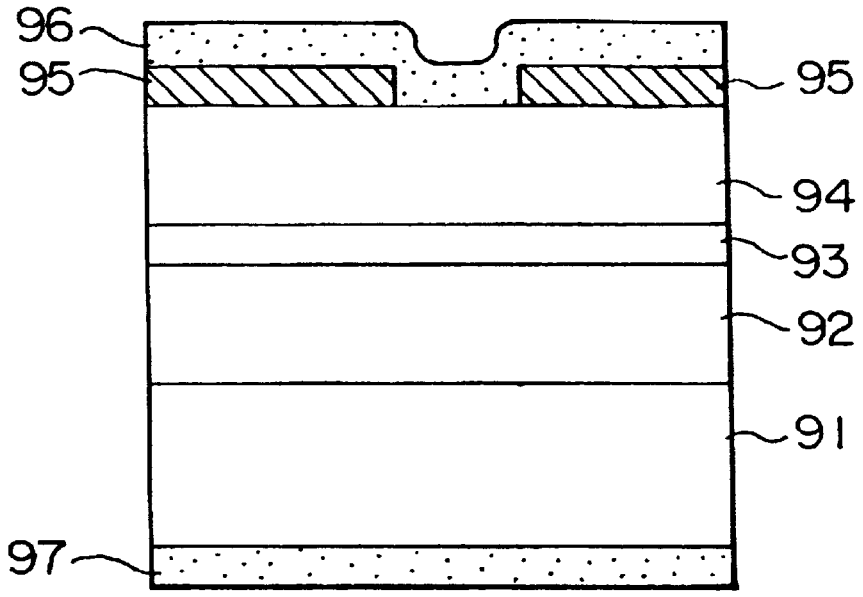
FIG. 9 is an enlarged schematic sectional view of another embodiment of the surface emitting diode according to the present invention.

FIG. 9 shows a sectional view of the structure of a semiconductor laser to which the present invention is applied. In FIG. 9, reference numeral 91 denotes an n-type (110) Si substrate, 92 denotes an n-type GaP clad layer (1 $\mu$m), 93 denotes a non-doped $GaN_{0.1}As_{0.9}$ active layer (50 nm), and 94 denotes a p-type GaP clad layer (1 $\mu$m). The layers from 92 to 94 were formed by growing crystals on the Si substrate 91 continuously in a high vacuum of $1\times10^{-2}$ Torr in a chemical beam epitaxial system. Metals were used as group III materials, phosphine and arsine were used to obtain P and As, and nitrogen radical was used as nitrogen material. The wafer on which crystals had been grown was provided with a current bottleneck layer 95 made of a silicon nitride film, a p-type electrode 96, and an n-type electrode 97, and the wafer is cleaved to obtain a chip 300 $\mu$m square. When a current was conducted into a semiconductor laser, the laser emitted a near infrared laser beam. In this embodiment, GaP was used for the clad layer, but $Al_aGa_{1-a}P$ ($0\leqq a=1$) may be used which is obtained by adding Al to the GaP to increase the band gap difference in relation to the active layer. It is more preferable to add N to this $Al_aGa_{1-a}P$ to prepare $Al_aGa_{1-a}N_xP_{1-x}$ ($0\leqq a\leqq1$, $0<x<1$) so as to be completely lattice matched to the substrate crystal.

EMBODIMENT 6

Figure 10:
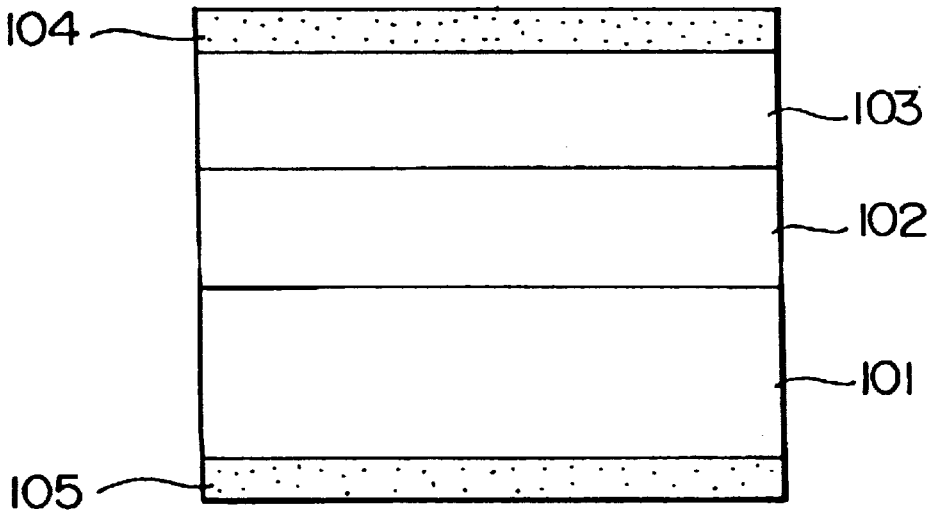
FIG. 10 is an enlarged schematic sectional view of an embodiment of a light emitting diode according to the present invention.

FIG. 10 is a sectional view of the structure of a light emitting diode to which the present invention is applied. In FIG. 10, reference numeral 101 denotes an n-type (100) GaP substrate, 102 denotes an n-type $InN_{0.4}P_{0.6}$ layer (1 $\mu$m thick), and 103 denotes a p-type $InN_{0.4}P_{0.6}$ layer (1 $\mu$m thick). The layers 102, 103 were formed by growing crystals on the GaP substrate 101 continuously in high vacuum of $1\times10^{-3}$ Torr in a chemical beam epitaxial system. Organometallic compounds were used as materials for group III elements, phosphine and arsine were used to obtain P and As, and nitrogen radical was used as nitrogen material. The wafer on which the crystal growth was completed was provided with a p-type transparent electrode 104 and an n-type electrode 105. When a current is applied at room temperature to the diode thus produced, the emission of red light was observed.

With regard to the optical devices in the above embodiments, the fabrication of the laser diode, photodiode and light emitting diode has been described, but needless to say, the present invention can be applied to other optical semiconductor devices, such as an optical modulator. It is also needless to say that the present invention can be applied to electronic devices other than the MOS-FET, and that Si-ICs already in practical use can be applied. The materials in the present invention can be applied to electronic devices, such as transistors and so on. The optical devices in Embodiments 1 and 2 are integrated with electronic devices but, of course, the optical devices can operate as independent devices. In Embodiments 1 to 5, Si was used as the substrate crystal, but GaP and AlP having almost the same lattice constant as Si may be used. In the stress compensated strained superlattice layer, a wide variety of N-containing AlGaInNPAsSb other than GaNP and AlP may be used as the material for the component layers under compressive strain.

According to the present invention, III–V alloy semiconductors can be epitaxially grown on Si substrates without generating of misfit dislocations, so that it has become possible to provide semiconductor devices which can be monolithically integrated with Si based electronic devices and can apply this technique to OEIC.

What is claimed is:

1. A method for manufacturing a semiconductor device, comprising the step of:

epitaxially growing a plurality of semiconductor layers by using materials selected from the group consisting of Al, Ga, In, N, P, As and Sb, said plurality of semiconductor layers including a layer of nitrogen-containing alloy semiconductor $Al_aGa_bIn_{1-a-b}N_xP_yAs_zSb_{1-x-y-z}$ ($0\leqq a\leqq1$, $0\leqq b\leqq1$, $0<x<1$, $0\leqq y<1$, $0\leqq z<1$) formed using nitrogen radical as nitrogen material, in a vacuum of substantially $10^{-2}$ Torr or higher vacuum.

2. A semiconductor device manufactured by the manufacturing method according to claim 1.

3. A method for manufacturing a semiconductor device, comprising the step of:

epitaxially growing a plurality of semiconductor layers by using materials selected from the group consisting of Al, Ga, In, N, P, As and Sb, said plurality of semiconductor layers including a layer of nitrogen-containing alloy semiconductor $Al_aGa_bIn_{1-a-b}N_xP_yAs_zSb_{1-x-y-z}$ ($0\leqq a\leqq1$, $0\leqq b\leqq1$, $0<x<1$, $0\leqq y<1$, $0\leqq z<1$) formed using nitrogen radical as nitrogen material, in a vacuum of substantially $10^{-2}$ Torr or higher vacuum, wherein, in said epitaxially growing a plurality of semiconductor layers, for at least two semiconductor layers out of said plurality of semiconductor layers, a value of lattice strain of said at least two semiconductor layers is controlled so as to be less than a critical strain at which misfit dislocations are generated at an interface between said two adjacent semiconductor layers.

4. A manufacturing method according to claim 3, wherein in a process for growing at least one of said plurality of semiconductor layers, a stress compensated layer with the stress canceled is formed by alternately depositing layers having compressive strain and layers having tensile strain, and each said layer having tensile strain is said nitrogen-containing alloy semiconductor $Al_aGa_bIn_{1-a-b}N_xP_yAs_zSb_{1-x-y-z}$ ($0\leqq a\leqq1$, $0\leqq b\leqq1$, $0<x<1$, $0\leqq y<1$, $0\leqq z<1$).

5. A semiconductor device manufactured by the manufacturing method according to claim 3.

6. A manufacturing method according to claim 3, wherein said nitrogen radical is nitrogen obtained by activating nitrogen molecules by radio frequency plasma.

7. A manufacturing method according to claim 3, wherein the plurality of semiconductor layers are semiconductor layers stacked on one another on a substrate, the substrate being a silicon substrate.

8. A manufacturing method according to claim 7, wherein said silicon substrate has semiconductor elements formed thereon.

9. A method for manufacturing a semiconductor device, comprising the steps of:

preparing Al, Ga, In, N, P, As and Sb as materials for a semiconductor device; and epitaxially growing a plurality of semiconductor layers by using said materials, including a layer of nitrogen-containing alloy semiconductor $Al_aGa_bIn_{1-a-b}N_xP_yAs_zSb_{1-x-y-z}$ ($0 \leqq a \leqq 1$, $0 \leqq b \leqq 1$, $0<x<1$, $0 \leqq y<1$, $0 \leqq z<1$) using nitrogen radical as nitrogen material, in a vacuum of substantially $10^{-2}$ Torr or higher, wherein as impurity materials for said semiconductor device, C, Be, Si and Sn are used.

10. A method for manufacturing a semiconductor device, comprising the steps of:

preparing Al, Ga, In, N, P, As and Sb as materials for a semiconductor device; and epitaxially growing a plurality of semiconductor layers by using said materials, including a layer of nitrogen-containing alloy semiconductor $Al_aGa_bIn_{1-a-b}N_xP_yAs_zSb_{1-x-y-z}$ ($0 \leqq a \leqq 1$, $0 \leqq b \leqq 1$, $0<x<1$, $0 \leqq y<1$, $0 \leqq z<1$) using nitrogen radical as nitrogen material, in a vacuum of substantially $10^{-2}$ Torr or higher, wherein said nitrogen radical is nitrogen obtained by activating nitrogen molecules by radio frequency plasma.

11. A method for manufacturing a semiconductor device, comprising the steps of:

preparing Al, Ga, In, N, P, As and Sb as materials for a semiconductor device; and epitaxially growing a plurality of semiconductor layers by using said materials, including a layer of nitrogen-containing alloy semiconductor $Al_aGa_bIn_{1-a-b}N_xP_yAs_zSb_{1-x-y-z}$ ($0 \leqq a \leqq 1$, $0 \leqq b \leqq 1$, $0<x<1$, $0 \leqq y<1$, $0 \leqq z<1$) using nitrogen radical as nitrogen material, in a vacuum of substantially $10^{-2}$ Torr or higher, wherein the plurality of semiconductor layers are semiconductor layers stacked on one another on a substrate, the substrate being a silicon substrate.

12. A manufacturing method according to claim 11, wherein said silicon substrate has semiconductor elements formed thereon.

*13. A method for manufacturing a semiconductor device, comprising the step of:*

*growing a plurality of semiconductor layers by using materials selected from the group consisting of Al, Ga, In, N, P, As and Sb, said plurality of semiconductor layers including a layer of nitrogen-containing alloy semiconductor* $Al_aGa_bIn_{1-a-b}N_xP_yAs_zSb_{1-x-y-z}$ *($0 \leqq a \leqq 1$, $0 \leqq b \leqq 1$, $0<x<1$, $0 \leqq y<1$, $0 \leqq z<1$) formed using nitrogen radical as nitrogen material, in a vacuum of substantially $10^{-2}$ Torr or higher vacuum.*

* * * * *

UNITED STATES PATENT AND TRADEMARK OFFICE

CERTIFICATE OF CORRECTION

PATENT NO. : RE 38,072 E
APPLICATION NO. : 09/924504
DATED : April 8, 2003
INVENTOR(S) : M. Kondow et al.

It is certified that error appears in the above-identified patent and that said Letters Patent is hereby corrected as shown below:

On the title page, item (73), please change the Assignee as shown below.

--OpNext Japan Inc., Yokohama, Japan--.

Signed and Sealed this

Fifteenth Day of August, 2006

JON W. DUDAS
*Director of the United States Patent and Trademark Office*